(12) United States Patent
Westfall

(10) Patent No.: US 7,126,091 B1
(45) Date of Patent: Oct. 24, 2006

(54) WORKPIECE HOLDER FOR VACUUM PROCESSING

(75) Inventor: Raymond Thomas Westfall, Seminole, FL (US)

(73) Assignee: Eclipse Energy Systems, Inc., Saint Petersburg, FL (US)

( * ) Notice: Subject to any disclaimer, the term of this patent is extended or adjusted under 35 U.S.C. 154(b) by 0 days.

(21) Appl. No.: 10/907,160

(22) Filed: Mar. 23, 2005

(51) Int. Cl.
*H05B 3/68* (2006.01)

(52) U.S. Cl. .................... 219/444.1; 219/462.1
(58) Field of Classification Search ............. 219/443.1, 219/444.1, 445.1, 446.1, 448.11, 448.12, 219/476, 490, 497; 118/724, 725, 621, 624, 118/625; 361/233, 234
See application file for complete search history.

(56) References Cited

U.S. PATENT DOCUMENTS

| | | | | |
|---|---|---|---|---|
| 2,152,126 | A * | 3/1939 | Young ...................... | 219/465.1 |
| 3,789,190 | A * | 1/1974 | Orosy et al. ................ | 219/497 |
| 4,685,095 | A | 8/1987 | Remeas et al. | |
| 5,001,594 | A * | 3/1991 | Bobbio ....................... | 361/234 |
| 5,464,965 | A * | 11/1995 | McGregor et al. .......... | 219/497 |
| 5,822,172 | A | 10/1998 | White | |
| 5,847,918 | A | 12/1998 | Shufflebotham et al. | |
| 5,904,872 | A * | 5/1999 | Arami et al. ............ | 219/444.1 |
| 6,133,557 | A * | 10/2000 | Kawanabe et al. ......... | 219/544 |
| 6,781,812 | B1 | 8/2004 | Fuwa et al. | |
| 2005/0118450 | A1* | 6/2005 | Fujii et al. .................. | 428/621 |

* cited by examiner

*Primary Examiner*—S. Paik
(74) *Attorney, Agent, or Firm*—David Kiewit

(57) ABSTRACT

A substrate for use in a vacuum chamber has a workpiece supporting surface that has two or more mutually electrically insulated bifilar conductors configured as interleaved spirals disposed on it. Each of these bifilar conductors has a respective electrode at each of its two ends. This provides an electrostatic chuck for clamping a workpiece to the supporting surface when an electric voltage is applied between the two bifilar conductors or between one of the two bifilar conductors and an insulating workpiece. This arrangement also provides for electric heating of the workpiece when an electric voltage is applied between the two electrodes associated with one of the bifilar conductors. Moreover, when the electrical resistance of at least one of the bifilar conductors is known as a function of temperature, this arrangement allows one to sense the temperature of a workpiece supported on the substrate.

4 Claims, 8 Drawing Sheets

WORKPIECE HOLDER FOR VACUUM PROCESSING

FIELD OF THE INVENTION

The present invention relates to apparatus for retaining and/or heating a workpiece. Of particular interest is the matter of electrostatically clamping a workpiece to a substrate or platen, such as may be used for a chemical or physical vapor deposition process carried out at pressures below ambient.

BACKGROUND INFORMATION

Electrostatic clamping arrangements are often used to hold a workpiece being processed at pressures below ambient pressure—i.e., in a vacuum environment. Such processes may include, but are not limited to, chemical and physical material deposition, etching and ion implantation. In many cases, the processes are carried out as part of an overall process of fabricating an electronic product such as an integrated circuit or a display element. A variety of workpieces may thus be involved and include electrically conducting workpieces (e.g., thin sheets of metal, carbon, or other electrically conductive material) and electrically semi-conducting workpieces (e.g., silicon wafers on which integrated circuit elements are being formed) or insulating workpieces (e.g., glass substrate portions of an optical display).

In U.S. Pat. No. 6,781,812 Fuwa et al. describe an electrostatic chuck in which the electrodes comprise interleaved spiral conductors electrically insulated from each other and from a substrate. When an electric field having a high rate of spatial change is established between the two conductors, a gradient force acts on an adjacent workpiece and clamps it to the substrate regardless of whether it is electrically insulating or conducting. Fuwa et al. do not teach the use of a bifilar conductor to avoid generating extraneous magnetic fields at the working surface of the workpiece, nor do they teach the use of their spiral structures as resistance heaters.

In many of the processes for which electrostatic clamping is used, one needs to consider heat transfer between the workpiece and a platen or other supporting surface to which the workpiece is clamped. Resistance heating elements are often disposed in or on a substrate in order to heat the workpiece to a desired initial temperature for the process. In addition, because many of the processes (such as sputtering or ion implantation) involve depositing significant energy on the workpiece, provision is often made to prevent overheating by transferring heat to the substrate. In some embodiments, this transfer process involves providing grooves in an otherwise flat substrate and flowing a gas, such as hydrogen or helium, through the grooves.

BRIEF SUMMARY OF THE INVENTION

In one embodiment, the invention provides apparatus for supporting a workpiece in a vacuum chamber. This apparatus comprises a substrate or platen, generally attached to the vacuum chamber and having a workpiece supporting surface that is usually flat. The apparatus of this embodiment also comprises two or more mutually electrically insulated bifilar conductors configured as interleaved spirals disposed on the workpiece supporting surface. Each of these bifilar conductors has a respective electrode at each of its two ends.

In a preferred embodiment, the invention provides an electrostatic chuck for clamping a workpiece to a supporting surface. This preferred chuck comprises two or more mutually electrically insulated bifilar conductors configured as interleaved spirals disposed on the workpiece supporting surface. Each of these bifilar conductors has a respective electrode at each of its two ends. Thus, when a source of electrical voltage is connected to the conductors so as to create an electric field between them, a fringing component of that field acts to clamp the workpiece to the supporting surface.

Another aspect of the invention is that it can provide an electric heating apparatus for heating a workpiece to a selected temperature when the workpiece abuts a workpiece supporting surface. This heater comprises at least one bifilar heating element configured as a spiral disposed on the workpiece supporting surface. This bifilar heating element has an electric resistance that varies as a function of temperature in a known manner. Thus, when a circuit for measuring the electrical resistance of the bifilar heating element is provided, one can determine the temperature of the heating element and of the workpiece to which it is thermally coupled and then control an electric power supply to supply current to the bifilar heating element if the temperature of the substrate is different than the selected temperature.

Although it is believed that the foregoing rather broad summary description may be of use to one who is skilled in the art and who wishes to learn how to practice the invention, it will be recognized that the foregoing recital is not intended to list all of the features and advantages. Those skilled in the art will appreciate that they may readily use both the underlying ideas and the specific embodiments disclosed in the following Detailed Description as a basis for designing other arrangements for carrying out the same purposes of the present invention and that such equivalent constructions are within the spirit and scope of the invention in its broadest form. Moreover, it may be noted that different embodiments of the invention may provide various combinations of the recited features and advantages of the invention, and that less than all of the recited features and advantages may be provided by some embodiments.

BRIEF DESCRIPTION OF THE SEVERAL VIEWS OF THE DRAWING

The invention may be best understood by recourse to the several views of the drawing. The reader will note that in the interest of clarity or presentation, some portions of this drawing depart from the conventional practice of shading exposed surfaces to distinguish different spiral conductors elements from each other.

DETAILED DESCRIPTION OF THE INVENTION

Figure 1:
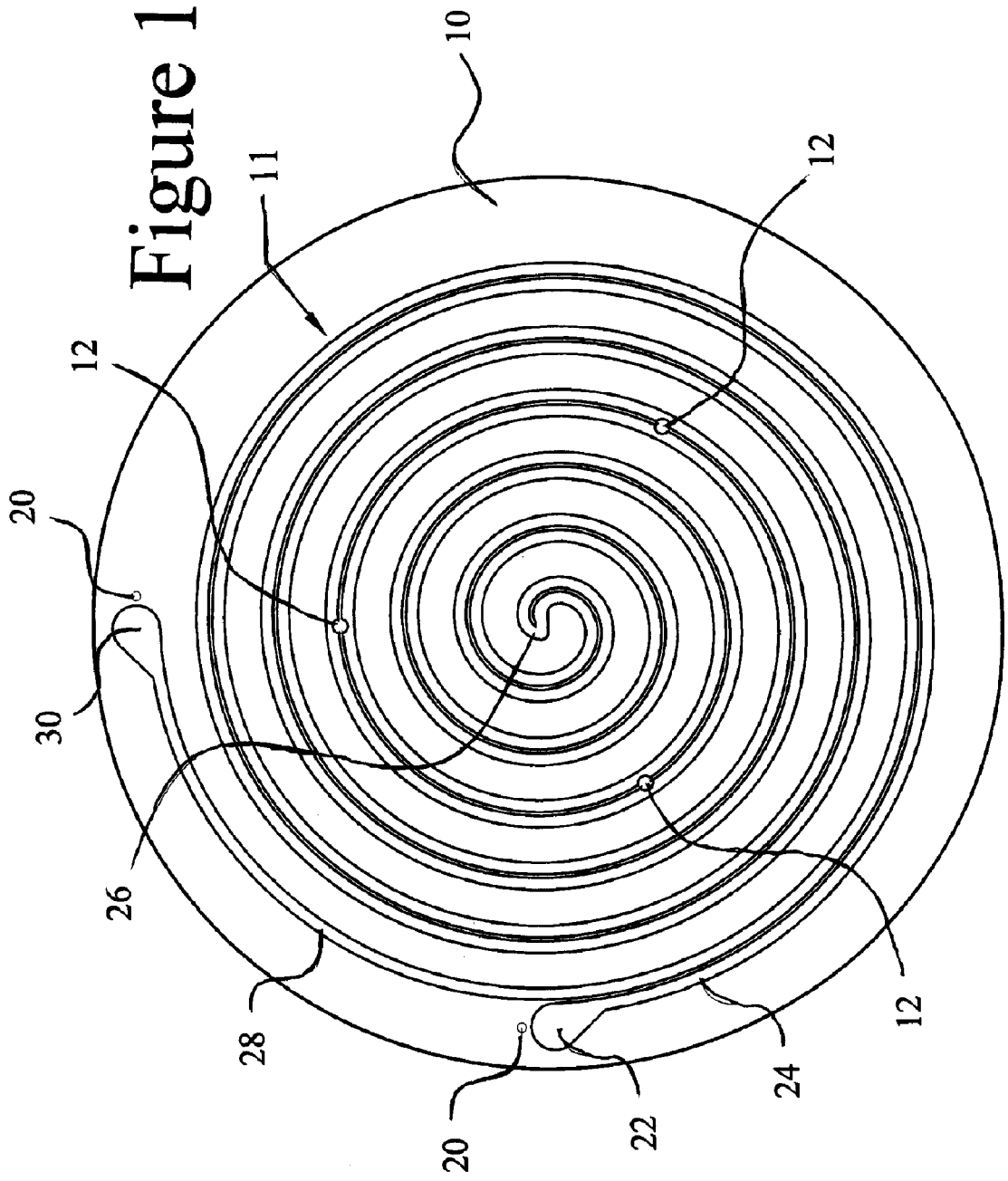
FIG. 1 is a plan view of a first bifilar spiral conductor disposed on an upper surface of a electrically insulating substrate.

In studying this Detailed Description, the reader may be aided by noting definitions of certain words and phrases used throughout this patent document. Wherever those definitions are provided, the reader should understand that in many, if not most instances, such definitions apply to both preceding and following uses of such defined words and phrases. At the outset of this Description, one may note that the terms "include" and "comprise," as well as derivatives thereof, mean inclusion without limitation; the term "or," is inclusive, meaning and/or; a 'bifilar conductor' stands for an element comprising two contiguous insulated conducting portions that are so close together that the inductance of the element is negligible when the two conducting portions carry the same current in opposite directions; 'flat platen' or 'substrate' stands for a support structure that is macroscopically flat, but that may have grooves or holes cut into its workpiece supporting surface, as may be required to allow a coolant gas to flow in the small plenum between the workpiece and the substrate. The workpiece is sometimes described as having a back surface that abuts the substrate and a front surface distal from the substrate.

An exemplar electrostatic chuck 9 for holding electrically insulating or electrically conductive workpieces in the form of flat disks comprises a substrate 10 and two or more bifilar conductors 11,13. In a particular preferred embodiment, the substrate is silicon nitride and the bifilar conductors are formed from a sputter-deposited and laser-etched platinum film having a thickness between one and ten microns.

A preferred substrate or platen 10 is made of an insulating material in the form of a thin flat disk penetrated by a plurality of circular holes 12, to provide access for electrically insulating pins 48, 52 used for elevating a workpiece 56 while it is being inserted or removed from the chuck. The preferred substrate also has fiducial marks 20 for aligning contacts 22, 30, 32, 40 of the bifilar clamping, heating, and temperature sensing elements 11, 13 with other portions of the chucking apparatus, as will be disclosed in detail later herein. Although the preferred substrate 10 is formed from an electrically insulating material, one could also use a insulator-coated metallic or semiconducting substrate body to provide an electrically insulating workpiece-supporting surface. Moreover, although this detailed description and drawing illustrate a common case in which a workpiece 56 is placed on top of an upper surface of a horizontally oriented substrate, those skilled in the art will appreciate that other orientations of the workpiece could also be used and that the electrostatic clamping force supplied by such a chuck is independent of its orientation.

Turning now to FIG. 1, one finds a first bifilar element 11 having an electrical contact 22 to an outermore portion 24 which is joined, near the center of the substrate 10, to an inner end of an innermore portion 28 which, in turn, extends to another electrical contact 30. The two spiraling portions 24, 28 are closely spaced to allow the electromagnetic fields produced by an electrical heating current flowing through the element 11 to cancel each other.

Figure 2:
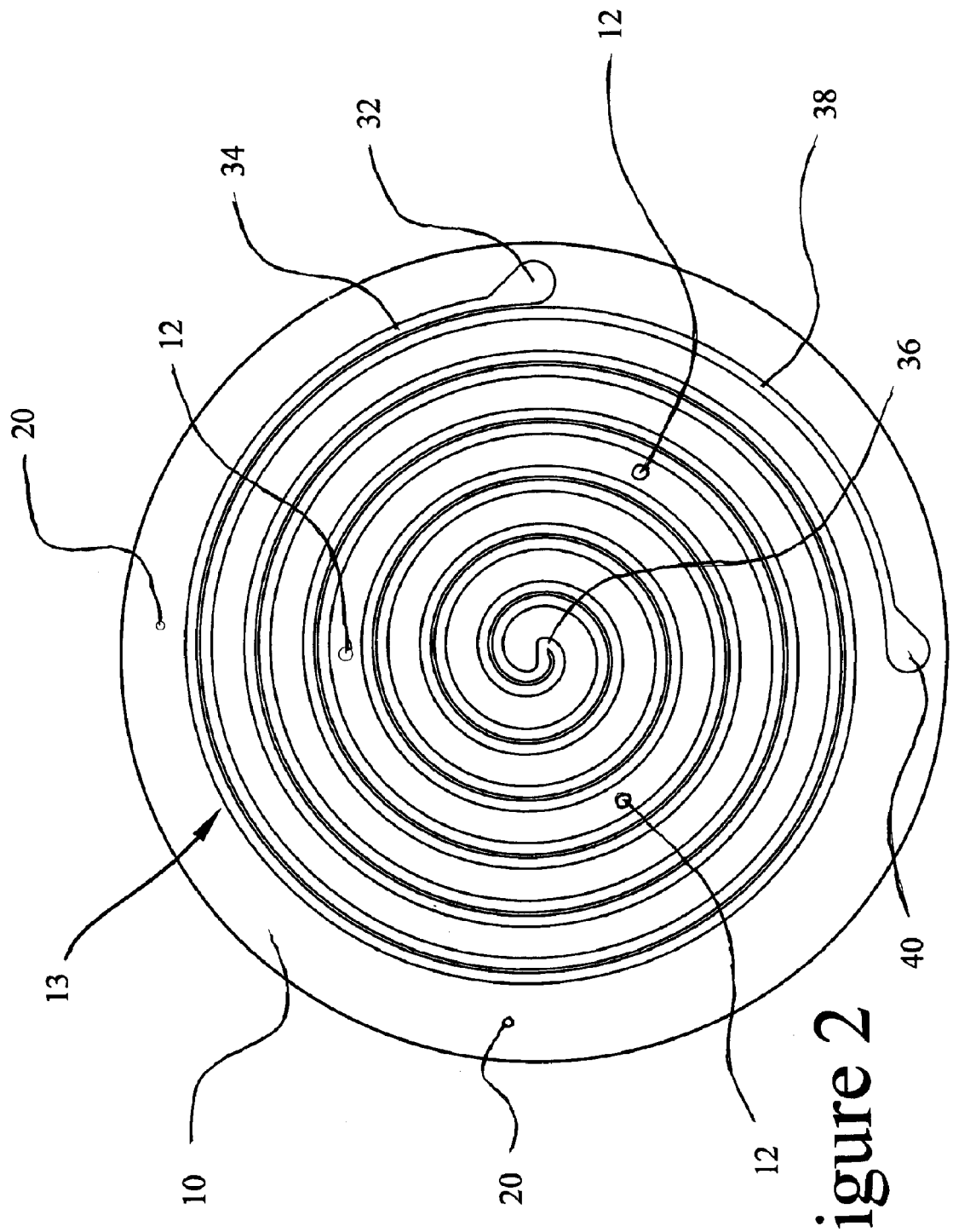
FIG. 2 is a plan view of a second bifilar spiral conductor disposed on an upper surface of a electrically insulating substrate.

A similar bifilar clamping/heating/temperature sensing element 13 is depicted in FIG. 2. It has an electrical contact 32 for its outermore portion 34, which is joined, near the center of the substrate, to the inner end of an innermore portion 38, that, in turn extends joined to a second electrical contact 40. These inward spiraling and outward spiraling elements are also closely spaced to provide electromagnetic field cancellation.

Figure 3:
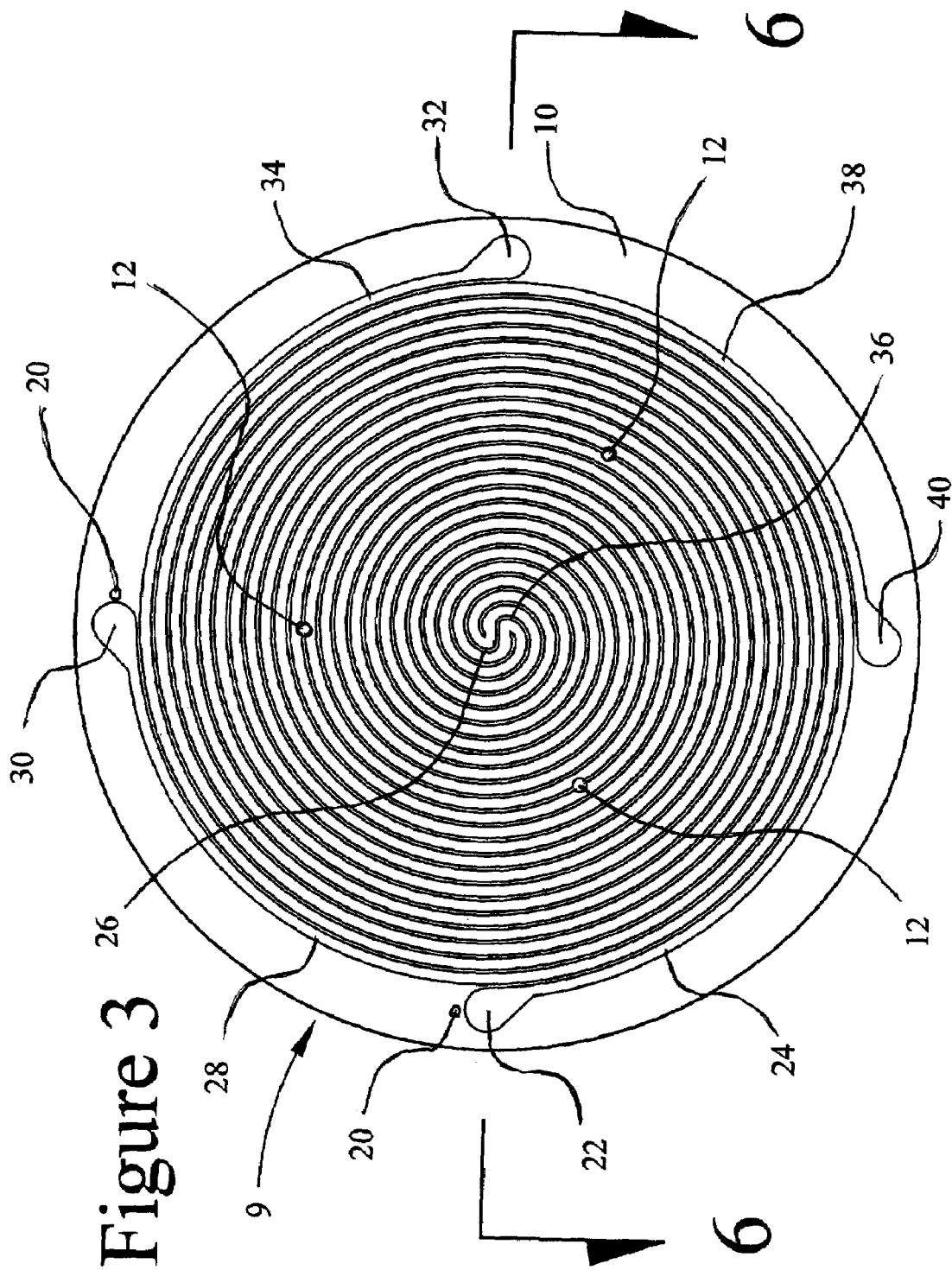
FIG. 3 is a plan view of an electrostatic chuck of the invention comprising two interleaved bifilar spiral conductors disposed on an upper surface of a substrate.

Turning now to FIG. 3, one finds an electric chuck 9 of the invention comprising interleaved bifilar elements 11,13 that are closely spaced but electrically insulated from each other. The reader may visualize this structure as resulting from overlaying the structures shown in FIGS. 1 and 2—i.e., interleaving the bifilar conductors 11, 13 on a common substrate 10. Those skilled in the art, however, will realize that the structure depicted in FIG. 3 is more reasonably realized by simultaneously forming the two bifilar conductors 11, 13 on the substrate 10 by any of a number of fabrication techniques known in the thin or thick film arts—e.g., by sputtering a film of platinum onto an insulating substrate and then photolithographically defining or laser etching the two bifilar conductors.

Figure 4:
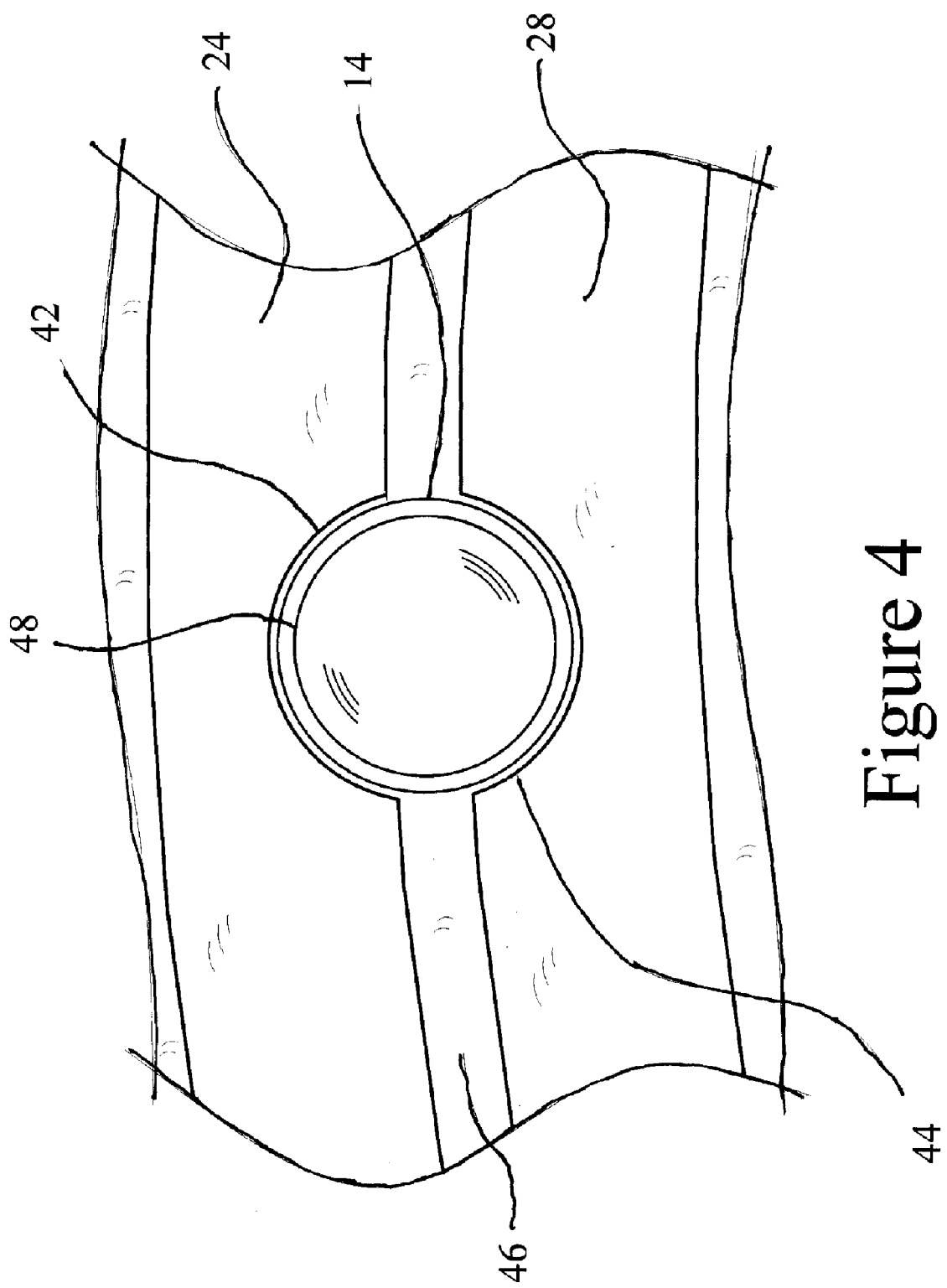
FIG. 4 is a detailed plan view depicting a pin for lifting a workpiece from a substrate.

As noted above, a preferred chuck 9 comprises several, preferably three, clearance holes, 12 spaced apart from each other through the insulating substrate 10. Each of these is used for an insulating elevator pin 48, as depicted in FIG. 4. Although the clearance holes 12 for the insulating elevator pins are shown as being located between the innermore 28 and outermore 24 spiraled portions of the first bifilar element 11, this arrangement will be recognized as one of convenience. As shown in the detailed view of FIG. 4, the conductors on either side of a hole 12 are relieved with cutouts 42, 44, to eliminate the possibility of contact with the elevator pin 48, while providing a minimum selected spacing between the conductors along the balance of their lengths.

Figure 5:
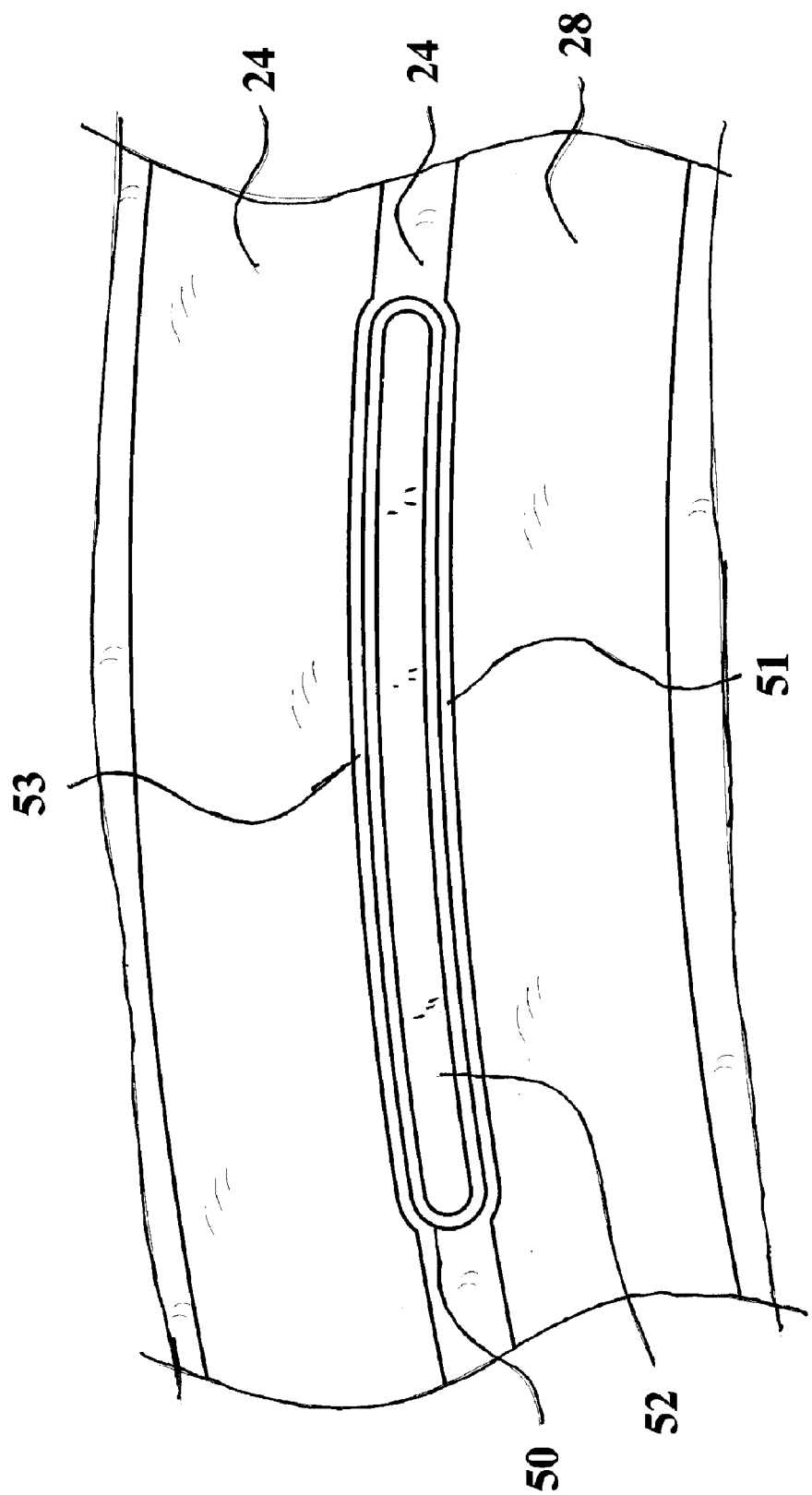
FIG. 5 is a plan view depicting a second embodiment of a pin for lifting a workpiece from a substrate.

These cut outs result in local reductions of the cross-sectional area of the bifilar conductor 11. If this element is used as a heater or a temperature sensing element, uniformity of the temperature or resolution of the measurement may be improved by utilizing the alternate embodiment shown in FIG. 5, where the elevator pin takes the form of a thin curved blade 52 made of an electrically insulating material. The alternate clearance hole must accommodate the shape of the thin curved blade so it must take the form of a curved slot 50. A set of typical relief cut outs 51, 53 may be provided in portions of the bifilar 11 to accommodate the curved slot design, as shown in FIG. 5. This provides a lesser local reduction in conductor area than does the arrangement depicted in FIG. 4.

Figure 6:
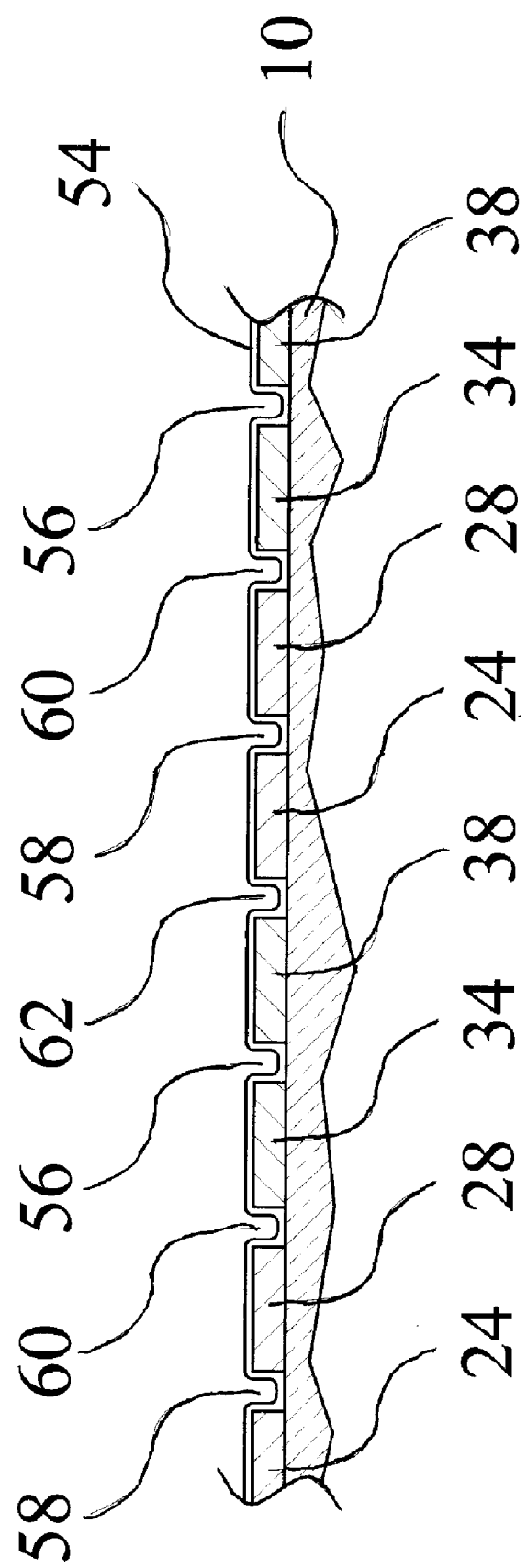
FIG. 6 is a detailed partial cross sectional view of an electrostatic chuck, the section taken as indicated by the arrow 6—6 in FIG. 3.

In order to use the electrostatic chuck 9 to hold electrically conductive workpieces, the bifilar elements 11, 13 must be coated with a high quality dielectric layer 54. In a preferred embodiment, the layer 54 is a conventionally formed silicon nitride film. FIG. 6 shows a detail of a cross section through a preferred electrostatic chuck 9 in which the respective outermore 24, 34 and innermore 28, 38 portions of two bifilar conductors 11, 13 are disposed directly on an insulating substrate 10.

Because the two portions 24, 28 of the first bifilar element 11 are joined at a central portion 26, when an external heating voltage is applied between the contacts 22, 30 the voltage between the innermore and outermore portions 24, 28 varies from zero at the central region where they are joined to a maximum adjacent the periphery of the substrate. The space 58 provides a selected width separating the two portions 24, 28, as shown in FIG. 6. Likewise, a space 56 separates the innermore and outermore portions of the second bifilar conductor 13. The external heating voltages applied across each of the first and second bifilar conductors also produce a clamping force which varies from zero at the center of the substrate to a maximum value adjacent the contacts 22, 30, 32, 40.

The two exemplar bifilar elements 11, 13 are electrically insulated from each other. The space between them 60 is selected to allow one to maintain a constant electrostatic field gradient when an external clamping voltage is applied between the two bifilar conductors. It is this gradient that provides the majority of the clamping force. Because this gradient must remain constant in the clamping mode, the preferred bifilar conductors are completely surrounded by a high quality electrical insulator. To that end, the preferred insulator layer 54, covers the tops and sides of all the first and second elements as well as the bottoms of the spaces between the elements.

The apparatus of the invention provides a means for clamping and holding a workpiece to a substrate while accurately measuring and uniformly controlling the temperature of that workpiece. This apparatus may be used in a vacuum environment where the only methods of thermal transfer are thermal conduction and radiation. Ordinary surfaces are not actually flat on a microscopic level. As a result, only a very small percentage of a workpiece is likely to be in physical contact with the bifilar heating elements 11, 13, so that direct thermal conduction at the contact areas is likely to be inadequate. Moreover, at temperatures that are generally of interest in vapor deposition processes, thermal transfer by the radiation process is exceedingly slow and ineffective. It is well known in the art to address this problem by introducing a small amount of helium gas to maintain a low pressure between the heater and the workpiece. This greatly accelerates the thermal transfer process without significantly impacting the operating pressure of the vacuum system. The helium atoms bounce back and forth between the hot and cold surfaces, transferring thermal energy from the hot surfaces to the cold surfaces with each bounce.

Figure 7:
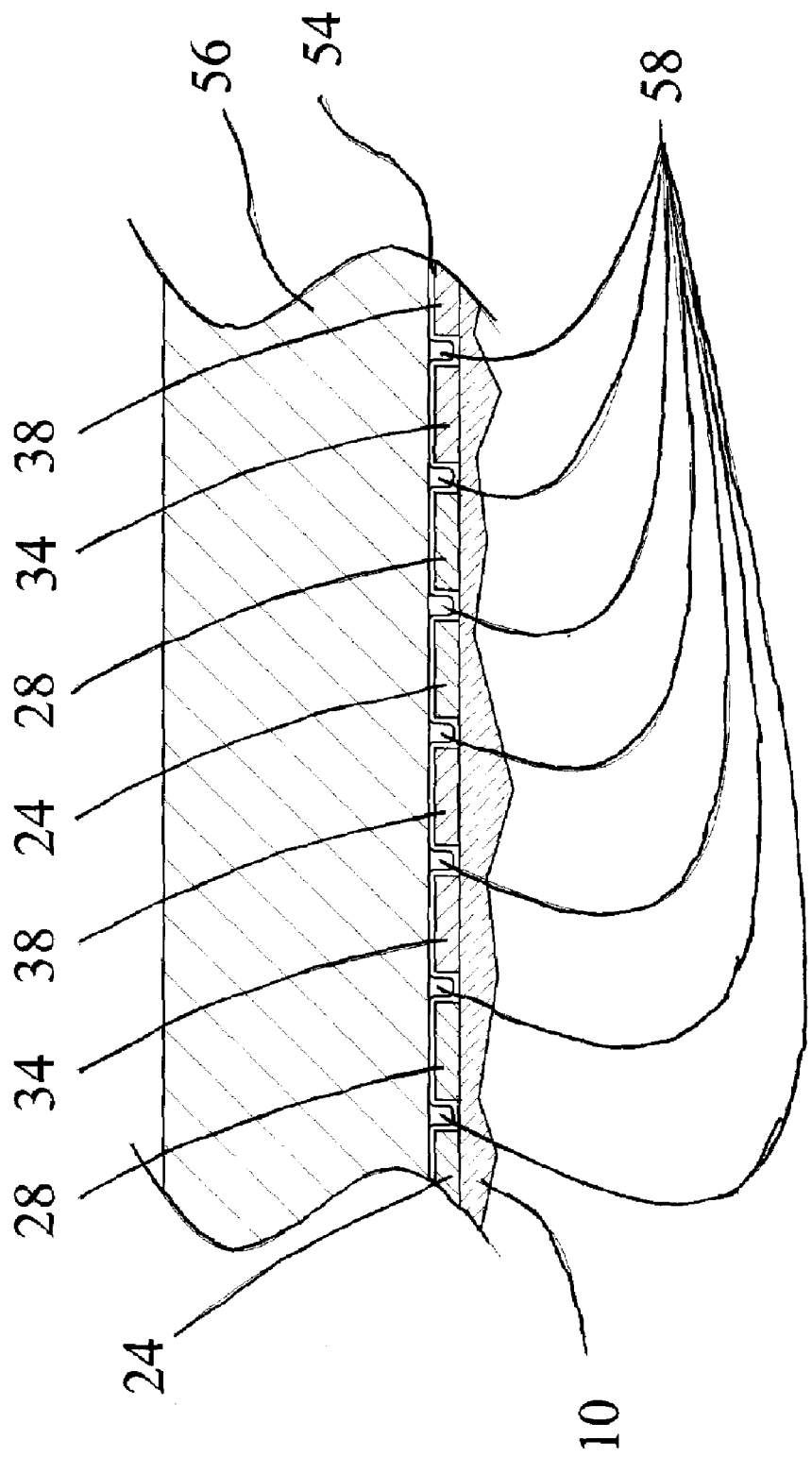
FIG. 7 is the detailed partial cross-sectional view of FIG. 6 depicting a workpiece retained on the electrostatic chuck.

FIG. 7 depicts a detail of a cross section of an electrostatic chuck according to this invention with a workpiece being held in place. The workpiece 56 is held tightly in place by the electrostatic chuck, thus forming a crude seal between itself and the insulating layer on the top of each of the two bifilar elements 11, 13. This creates two dead end spiral grooves and one double spiral groove that is open at both ends. These grooves 58, if blocked at the open ends, form a vacuum envelope for maintaining the proper helium pressure for optimum thermal transfer. Helium gas may advantageously be introduced into the dead end spiral grooves through the holes 12 in the substrate that also accommodate the elevator pins or curved blades. Moreover, helium may be introduced into the double spiral groove via a small hole or slot (not shown) through the center of the substrate.

In a preferred method of use, the two bifilar elements 11, 13 simultaneously serve as high voltage electrodes for an electrostatic chuck, as resistive electrical heating elements, and as precision distributed RTD (Resistive Thermal Detector) sensors.

As noted above, the electrostatic clamping action is accomplished by applying a high DC (Direct Current) voltage between the two bifilar elements 11, 13. The clamping forces are generated by the high voltage gradient between the two elements. The clamping force is greatest along the double spiral groove between bifilar elements.

Heating is accomplished by applying an appropriate DC voltage across one or both of the bifilar elements 11, 13. Magnetic fields produced by the current flowing through the elements are canceled because of the bifilar design of the current carrying elements. At any given point along the element the magnetic field produced by the inward flowing current is cancelled out by the magnetic field produced by the outward flowing current in the adjacent portion of the same element.

Distributed, or average, temperature sensing is accomplished by the concurrent measurement of a voltage drop across either or both of the bifilar heating element(s) and of the associated current flow(s). A preferred heating element is comprised of a chemically stable high melting point material, such as platinum, which has an electrical resistivity that is a known monotonic function of its temperature. In a preferred embodiment both the heating element and the substrate are very thin and uniform in composition. Hence the time constant for achieving thermal steady state with a workpiece is essentially equal to that of the workpiece itself. The time constant for one such system, when used with a silicon wafer as a workpiece, was a few seconds.

Figure 8:
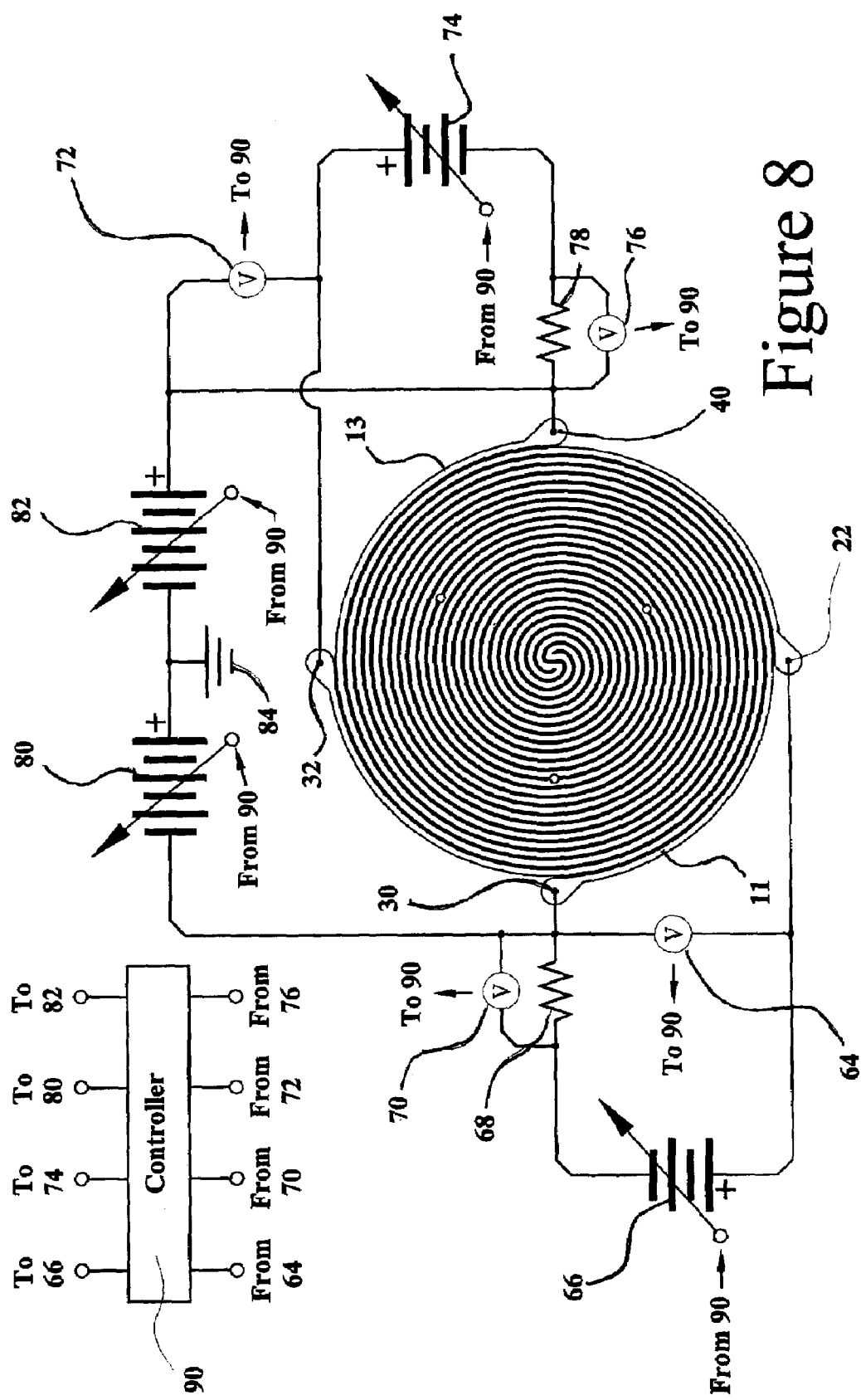
FIG. 8 is a schematic circuit diagram showing power supplies connected to an electrostatic chuck of the invention.

The operating configuration of an exemplar electrostatic chuck 9 is schematically represented if FIG. 8. In this embodiment DC power supplies 66, 74, 80, 82 are used for both clamping and heating functions to simplify the continuous and simultaneous measurement of the resistance of bifilar elements The heater current for the first element 111 is supplied by a low voltage, high current power supply 66.

Correspondingly, the heater current for the second bifilar element 13 is supplied by a second low voltage, high current power supply 74.

The outputs of the heating power supplies 66, 74 are automatically controlled responsive to signals that are a function of the temperature of the bifilar elements 11, 13. A preferred approach for doing this is to provide current sensing resistors 68, 78 respectively connected between the first and second bifilar elements 11, 13 and their associated power supplies 66, 74. These resistors are selected so that the voltage drop across them, in the range of interest, is a relatively linear function of the current flowing through them. Voltage sensors 70, 76 then generate feedback signals which are a linear function of the voltage drop across the respective current sensing resistors 68, 78 and supply those signals to a controller 90 that automatically controls the power supplies 66, 74 to increase or decrease the heating current so as to maintain a selected average temperature on the workpiece supporting surface. In preferred operating modes, in which the workpiece is held in close contact with the structure of the electrostatic chuck and low pressure helium is injected between them, the thermal profile of the workpiece may be accurately controlled.

FIG. 8 also depicts a preferred connection arrangement for the electrostatic clamping power supplies 80 and 82. Those skilled in the art will recognize that this clamping system will work with a single floating (without ground reference) electrically isolated power supply, but safety concerns lead to the use of two separate ground referenced power supplies. As shown in FIG. 8, the negative terminal of the first high voltage clamping power supply 80, is connected to one of the electrical contacts 30 of the first bifilar element 11. The positive terminal of the first high voltage clamping power supply 80, is connected to the negative terminal of the second high voltage clamping power supply 82, and it is also connected to an electrical ground 84. The positive terminal of the second high voltage clamping power supply 82 is connected to one of the electrical contacts 40 of the second bifilar element. One benefit of this design is that the power supplies 80, 82 need only operate at half the voltage that would be required from a single floating supply.

The current sensing resistors 68, 78, the heater power supplies 66, 74, and the voltage sensors 64, 70, 72, 76 are all electrically insulated from ground because they are all connected to the bifilar elements, which are operated at high voltage.

Although preferred embodiments of the invention have contact regions disposed adjacent a periphery of the platen, the reader will appreciate that one could also choose to locate the contact regions, accessible from a rear surface of the substrate, near the center of the platen and dispose the middle, joining portion of each bifilar conductor near the periphery.

In the preferred embodiment discussed above, the electrostatic chucking apparatus 9 comprises two interleaved conductors. The reader will appreciate that one could also choose to add additional pairs of conductors so as to form apparatus comprising four, six, or more interleaved bifilar spirals. Moreover, those skilled in the art will appreciate that a single bifilar spiral conductor, as depicted in FIGS. 1 and 2, can be used as a conventional (i.e., non-gradient, or non-fringing field) electrostatic clamping electrode, as a heater, and as a resistive temperature detector.

Although the present invention has been described with respect to a particular preferred embodiment, many modifications and alterations can be made without departing from the invention. Accordingly, it is intended that all such modifications and alterations be considered as within the spirit and scope of the invention as defined in the attached claims.

What is claimed is:

1. An electrostatic chuck for clamping a workpiece to a supporting surface of the chuck, the chuck comprising:
    at least two mutually electrically insulated bifilar conductors configured as interleaved spirals disposed entirely on the workpiece supporting surface, each of the bifilar conductors having a respective electrode at each of two ends thereof;
    a first electric power supply connected to at least two of the at least two bifilar conductors for creating an electric field therebetween, the electric field for clamping the workpiece to the workpiece supporting surface; and
    a second power supply connected to each of the two electrodes of one of the at least two bifilar conductors so that an electric current passed through the one of the at least two bifilar conductors heats the supporting surface of the chuck.

2. The electrostatic chuck of claim 1 wherein the workpiece supporting surface comprises a dielectric layer disposed over the at least two bifilar conductors, whereby the chuck is adapted to clamp an electrically conducting workpiece.

3. An electric heating apparatus for heating a workpiece to a selected temperature when the workpiece abuts a workpiece supporting surface of a substrate, the heating apparatus comprising:
    a first bifilar heating element configured as a spiral disposed entirely on the workpiece supporting surface of the substrate, the first bifilar heating element having an electric resistance that varies as a function of temperature in a known manner;
    a second bifilar heating element configured as a spiral interleaved with the first bifilar heating element on the workpiece supporting surface of the substrate, the first and second bifilar heating elements mutually electrically insulated from each other;
    a circuit for measuring the electrical resistance of the first bifilar heating element;
    a controller for controlling an electric current to a selected one of the bifilar heating elements responsive to the measured resistance; and
    an electric power supply for applying a voltage between the first and second bifilar heating elements for electrostatically clamping the workpiece to the workpiece supporting surface of the substrate.

4. Apparatus for supporting a workpiece, the apparatus comprising:
    a substrate having a workpiece supporting surface; and
    two or more mutually electrically insulated bifilar conductors configured as interleaved spirals disposed on the workpiece supporting surface, each of the bifilar conductors having a respective electrode at each of two ends thereof;
    a first electric power supply connected to each of the two electrodes of one of the bifilar conductors, whereby an electric current from the first power supply passed through that bifilar conductor serves to heat the substrate; and
    a second electric power supply connected to at least two of the at least two bifilar conductors so as to create an electric potential therebetween, the electric potential for clamping the workpiece to the substrate.

* * * * *